US010141955B2

(12) United States Patent
Andrade Costa et al.

(10) Patent No.: US 10,141,955 B2
(45) Date of Patent: Nov. 27, 2018

(54) METHOD AND APPARATUS FOR SELECTIVE AND POWER-AWARE MEMORY ERROR PROTECTION AND MEMORY MANAGEMENT (71) Applicant: International Business Machines Corporation, Armonk, NY (US)

(72) Inventors: Carlos H. Andrade Costa, White Plains, NY (US); Chen-Yong Cher, Port Chester, NY (US); Yoonho Park, Chappaqua, NY (US); Bryan S. Rosenburg, Cortlandt Manor, NY (US); Kyung D. Ryu, New City, NY (US)

(73) Assignee: International Business Machines Corporation, Armonk, NY (US)

( * ) Notice: Subject to any disclaimer, the term of this patent is extended or adjusted under 35 U.S.C. 154(b) by 312 days.

(21) Appl. No.: 14/684,368

(22) Filed: Apr. 11, 2015

(65) Prior Publication Data
US 2016/0301428 A1    Oct. 13, 2016

(51) Int. Cl.
*H03M 13/35* (2006.01)
*G06F 11/10* (2006.01)
*H03M 13/51* (2006.01)

(52) U.S. Cl.
CPC ....... *H03M 13/356* (2013.01); *G06F 11/1048* (2013.01); *G06F 11/1076* (2013.01); *H03M 13/353* (2013.01)

(58) Field of Classification Search
CPC .............. H03M 13/356; H03M 13/353; G06F 11/1072; G06F 11/1076; G06F 11/1008; G06F 11/1068
See application file for complete search history.

(56) References Cited

U.S. PATENT DOCUMENTS 6,748,445 B1 *  6/2004  Darcy .................... H04L 47/27
                                                    370/468
9,430,339 B1 *  8/2016  Song ................... G06F 11/1666
(Continued)

FOREIGN PATENT DOCUMENTS

DE     102009037630 A    2/2011
JP       2006309687 A   11/2006
WO      2009072103 A2    6/2009

OTHER PUBLICATIONS

Yim, Keun Soo, et al., "Measurement-based analysis of fault and error sensitivities of dynamic memory," IEEE/IFIP International Conference on Dependable Systems and Networks (DSN), pp. 431-436, Jun. 28-Jul. 1, 2010.
(Continued)

*Primary Examiner* — April Y Blair
*Assistant Examiner* — Dipakkumar Gandhi
(74) *Attorney, Agent, or Firm* — Daniel P. Morris, Esq.; Hoffmann & Baron, LLP (57) ABSTRACT A method for providing selective memory error protection responsive to a predictable failure notification associated with at least one portion of a memory in a computing system includes: obtaining an active error correcting code (ECC) configuration corresponding to the portion of the memory; determining whether the active ECC configuration is sufficient to correct at least one error in the portion of the memory affected by the predictable failure notification; when the active ECC configuration is insufficient to correct the error, determining whether data corruption can be tolerated by an application running on the computing system; when data corruption cannot be tolerated by the application, determining whether a stronger ECC level is available and, if a stronger ECC level is available, increasing a strength of the active ECC configuration; and when data corruption can
(Continued)

be tolerated, performing page reassignment and aggregation of non-critical data.

20 Claims, 4 Drawing Sheets

(56) References Cited

U.S. PATENT DOCUMENTS

| | | | |
|---|---|---|---|
| 2002/0018389 A1* | 2/2002 | Ito | G06F 11/1008 365/222 |
| 2005/0132259 A1* | 6/2005 | Emmot | G06F 11/1008 714/752 |
| 2008/0072120 A1* | 3/2008 | Radke | G06F 11/1068 714/768 |
| 2009/0241010 A1* | 9/2009 | Yano | G06F 11/1072 714/764 |
| 2010/0199149 A1 | 8/2010 | Weingarten et al. | |
| 2010/0332950 A1* | 12/2010 | Billing | G06F 11/1008 714/768 |
| 2011/0194205 A1* | 8/2011 | Kim | G11B 20/1816 360/53 |
| 2011/0320869 A1 | 12/2011 | Gower et al. | |
| 2012/0221905 A1* | 8/2012 | Burger | G06F 11/073 714/723 |
| 2014/0136915 A1* | 5/2014 | Hyde | G06F 11/0703 714/747 |
| 2015/0074367 A1 | 3/2015 | Cher et al. | |
| 2015/0074469 A1 | 3/2015 | Cher et al. | |

OTHER PUBLICATIONS

Wang, Shuo, et al., "Exploiting memory soft redundancy for joint improvement of error tolerance and access efficiency," IEEE Transactions on Very Large Scale Integration (VLSI) Systems, vol. 17, No. 8, pp. 973-982, Aug. 2009.

Qin, Feng, et al., "SafeMem: Exploiting ECC-Memory for Detecting Memory Leaks and Memory Corruption During Production Runs," In Proceedings of the 11th International Symposium on High-Performance Computer Architecture. (HPCA), pp. 291-302, 2005.

Song Liu, et al., "Flikker: Saving DRAM Refresh-power Through Critical Data Partitioning," In Proceedings of the Sixteenth International Conference on Architectural Support for Programming Languages and Operating Systems (ASPLOS XVI), pp. 213-224, ACM, New York, NY, 2011.

Song Fu and Cheng-Zong Xu, "Exploring Event Correlation for Failure Prediction in Coalitions of Clusters," In Proceedings of the 2007 ACM/IEEE Conference on Supercomputing, pp. 41:1-41:12, New York, NY, 2007.

A.R. Alameldeen et al., "Energy-Efficient Cache Design Using Variable-Strength Error-Correcting Codes," 38th Annual International Symposium on Computer Architecture (ISCA), p. 461-472, Jun. 2011.

C.-H. Lin et al., "SECRET: Selective Error Correction for Refresh Energy reducTion in DRAMs," 2012 IEEE 30th International Conference on Computer Design (ICCD), pp. 67-74, 2012.

S. Li et al., "MAGE: Adaptive Granularity and ECC for Resilient and Power Efficient Memory Systems," Proceedings of the International Conference on High Performance Computing, Networking, Storage and Analysis (SC '12), pp. 33:1-33:11, 2012.

* cited by examiner

METHOD AND APPARATUS FOR SELECTIVE AND POWER-AWARE MEMORY ERROR PROTECTION AND MEMORY MANAGEMENT

STATEMENT OF GOVERNMENT RIGHTS

This invention was made with Government support under Contract No. B599858 awarded by the Department of Energy. The Government has certain rights in this invention.

BACKGROUND OF THE INVENTION

The present invention relates generally to the electrical, electronic and computer arts, and, more particularly, to memory error protection and management.

In high-performance computing (HPC), typically two or more servers or computers are connected with high-speed interconnects in an HPC cluster. A cluster consists of several servers networked together that act as a single system, where each server in the cluster performs one or more specific tasks. Each of the individual computers or servers in the cluster may be considered a node. The nodes work together to accomplish an overall objective. As such, subtasks are executed on the nodes in parallel to accomplish the overall objective. However, a failure of any one subtask results in a failure of the entire parallel task.

Uncorrected errors in the main memory ("memory") of the computer are one of the primary reasons HPC systems crash or fail. For example, uncorrected errors may cause a crash due to an unrecoverable corruption of an operating system of the HPC system or an application running on the HPC system, which then may require the system or application to be restarted. After the crash, sometimes the application may resume from a predefined checkpoint.

A machine check is one way in which system hardware may indicate an internal error. Machine check handlers have been used to signal to the operating system the occurrence of memory parity check errors encountered by a memory controller and that cannot be corrected by a memory protection mechanism, such as error-correcting codes (ECC), for instance. The memory controller also accounts for corrected and harmless errors. Corrected and harmless errors are errors that do not generate a machine check exception. A machine check exception occurs when an error cannot be corrected by the hardware and in turn signals a machine check handler. Corrected and harmless errors may typically be tracked. Logs of corrected errors and the monitoring of a corrected error count compared to static thresholds have been used in proactive HPC system failure avoidance.

BRIEF SUMMARY

Principles of the invention, in accordance with one or more embodiments thereof, provide techniques for anticipating impacts of imminent memory failure when variable strength error-correcting codes (ECC) are used, and to perform memory management with adjustable memory error protection based, at least in part, on selective reliability for energy-efficiency improvement.

In one aspect, a method for providing selective memory error protection responsive to a predictable failure notification associated with at least one portion of a memory in a computing system, according to an aspect of the invention, includes the steps of: obtaining an active ECC configuration corresponding to the at least one portion of the memory; determining whether the active ECC configuration is sufficient to correct at least one error in the portion of the memory affected by the predictable failure notification; when the active ECC configuration is insufficient to correct the at least one error, determining whether data corruption can be tolerated by an application running on the computing system; when data corruption cannot be tolerated by the application, determining whether a stronger ECC level is available and, if a stronger ECC level is available, increasing a strength of the active ECC configuration; and when data corruption can be tolerated, performing page reassignment and aggregation of non-critical data.

In another aspect, an apparatus for performing selective memory error protection in a high-performance computing system is provided. The apparatus includes a memory and at least one processor coupled to the memory. The processor, responsive to a predictable failure notification associated with at least one portion of the memory, is configured: to obtain an active ECC configuration corresponding to the at least one portion of the memory; to determine whether the active ECC configuration is sufficient to correct at least one error in the at least one portion of the memory affected by the predictable failure notification; to determine, when the active ECC configuration is insufficient to correct the at least one error, whether data corruption can be tolerated by an application running on the computing system; to determine, when data corruption cannot be tolerated by the application, whether a stronger ECC level is available and if, a stronger ECC level is available, to increase a strength of the active ECC configuration; and, when data corruption can be tolerated, to perform page reassignment and aggregation of non-critical data in the memory.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

One or more embodiments of the invention or elements thereof can be implemented in the form of a computer program product including a computer readable storage medium with computer usable program code for performing the method steps indicated. Furthermore, one or more embodiments of the invention or elements thereof can be implemented in the form of a system (or apparatus) including a memory, and at least one processor that is coupled to the memory and operative to perform exemplary method steps. Yet further, in another aspect, one or more embodiments of the invention or elements thereof can be implemented in the form of means for carrying out one or more of the method steps described herein; the means can include (i) hardware module(s), (ii) software module(s) stored in a computer readable storage medium (or multiple such media) and implemented on a hardware processor, or (iii) a combination of (i) and (ii); any of (i)-(iii) implement the specific techniques set forth herein.

Techniques of the present invention can provide substantial beneficial technical effects. By way of example only and without limitation, one or more embodiments may provide one or more of the following advantages:

Provisioning of information about imminent failure to the operating system, enabling proactive adaptation before an uncorrectable error occurs;

Support for an application's notification about imminent failure, allowing the application to take proactive fault-handling actions at an application-level;

Improved system reliability through the anticipation of uncorrectable memory errors when ECC level is dynamically adjusted;

Proactive and dynamic coordination of ECC level based on data classification considering tolerance to corruption;

Control of memory protection in fine-grained resolution based on data classification; and Enabling power savings by the controlled corruption of non-critical data in cooperation with application.

These and other features and advantages of the present invention will become apparent from the following detailed description of illustrative embodiments thereof, which is to be read in connection with the accompanying drawings.

BRIEF DESCRIPTION OF THE SEVERAL VIEWS OF THE DRAWINGS

The following drawings are presented by way of example only and without limitation, wherein like reference numerals (when used) indicate corresponding elements throughout the several views, and wherein.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION

Principles of the present invention will be described herein in the context of illustrative embodiments of a computing system and method for anticipating the impacts of imminent memory failure when variable-strength error-correcting codes (ECC) are employed, and to perform memory management with adjustable memory error protection based on selective reliability for improving energy efficiency. It is to be appreciated, however, that the invention is not limited to the specific apparatus and/or methods illustratively shown and described herein. Rather, aspects of the present disclosure relate more broadly to apparatus and methods for providing selective memory error protection and memory management in a high-performance computing system in a manner which enhances power efficiency. Moreover, it will become apparent to those skilled in the art given the teachings herein that numerous modifications can be made to the embodiments shown that are within the scope of the claimed invention. That is, no limitations with respect to the embodiments shown and described herein are intended or should be inferred.

As previously stated, uncorrected errors in the memory of high performance computers (HPCs) are one of the primary causes of HPC system crashes, where the system or application may need to be restarted. In addition to uncorrected memory parity check and other errors, a memory controller may account for corrected and harmless errors, and store this information in the form of error logs in some storage means. Error logs and the monitoring of a corrected error rate and its comparison to a static threshold have been used to proactively avoid system failure or crashing; the terms "system failure" and "system crash" are used synonymously herein. However, the absolute rate of corrected memory errors, which may be determined from corrected error monitoring, is not a direct indication of a probable future memory failure, since memory failure is typically a dynamic function of one or more characteristics, including, but not limited to, manufacturing variation, surrounding conditions (e.g., temperature, supply voltage, etc.) and workload phases. For example, the shift in a threshold voltage of complementary metal-oxide-semiconductor (CMOS) transistors, which are often used in memory, may vary widely among individual semiconductor chips before they are deployed to the field due to manufacturing process variations, including variations in semiconductor oxide thickness, effective channel length and/or width of semiconductor transistors, and burn-in tests using higher voltages and/or temperatures.

One technique used to indicate early signs of memory health degradation, which can be used to determine the probability of memory failures, is health monitoring (i.e., health tracking) Health monitoring is a technique that relies on capabilities sometimes found in commodity and HPC components that provides sensor information which indicates memory and surrounding conditions. The data obtained by the sensors may be used to detect or indicate degradation processes such as, for example, electromigration (EM), negative bias temperature instability (NBTI), positive bias temperature instability (PBTI), temperature-dependent dielectric breakdown (TDDB), and hot carrier injection (HCI), among other conditions. A correlation between the information received or obtained by the sensors is used to predict memory failure dynamically at runtime. In particular, when a corrected error rate increases and exceeds (e.g., crosses) a statistically-defined threshold, one or more of the above memory health degradation conditions can be detected. One or more embodiments of the invention utilize notifications based on the reading and interpretation of the sensor data to determine whether a predicted failure is sufficient to exceed an error correction threshold of ECC applied to a specific portion of memory predicted to be affected.

The actual occurrence of uncorrectable memory errors caused by a predicted failure is dependent on the mechanism used for memory error protection, which is often statically defined and uniformly applied to the entire memory. Variable-length ECC mechanisms can be used in the mitigation of the high-performance and power overhead associated with traditional memory error detection and correction mechanisms. Transparent and dynamically-adjusted ECC has been proposed as a mechanism to correct memory errors introduced by low-power operation in cache architectures. It can be shown that failure probability is not uniformly distributed in this case and only a small number of cache lines are affected, for which stronger memory protection can be selectively applied. Moreover, transparent and auto-adjusted ECC is used to correct memory errors introduced by refresh rate prolongation for power optimization.

As an alternative to transparent and auto-adjusted ECC approaches, memory architectures with software-adjustable ECC strength have been proposed for memory usage and power optimization (see, e.g., C.-H. Lin, D.-Y. Shen, Y.-J. Chen, C.-L. Yang, and M. Wang, "SECRET: Selective Error Correction for Refresh Energy Reduction in DRAMs," 2012 *IEEE 30th International Conference on Computer Design (ICCD)*, 2012, pp. 67-74, the disclosure of which is incorporated herein by reference in its entirety). A commercial off-the-shelf (COTS) memory controller that allows the ECC level to be dynamically set by the operating system is described, for example, in Feng Qin et al., "SafeMem: Exploiting ECC-Memory for Detecting Memory Leaks and Memory Corruption During Production Runs," In *Proceedings of the 11th International Symposium on High-Performance Computer Architecture (HPCA)*, 2005, pp. 291-302, the disclosure of which is incorporated herein by reference in its entirety.

Achievable power reduction in auto-adjusted ECC memory systems typically depends on the control over the power state of additional storage and operation of specific logic used to implement the ECC. The additional storage requirement for many existing ECC implementations corresponds to about 12.5 percent of the available memory. However, while these approaches may provide some reduction in power consumption, the lack of information regarding health degradation related to non-uniform aging processes makes memory protected with auto-adjusted ECC potentially more vulnerable. Specifically, weaker ECC can be inadvertently applied to memory areas with predictable failures associated with degradation processes like NBTI or PBTI, for example. Additionally, the lack of awareness of data criticality at the hardware level prevents the exploitation of relaxed error protection in areas of memory holding non-critical data for power optimization.

The concept of data classes has been explored in different contexts for improving system resilience and power optimization. Allocation of non-critical data in memory with a lowered refresh rate can be used as a mechanism for power optimization. (See, e.g., Song Liu, et al., "Flikker: Saving DRAM Refresh-power Through Critical Data Partitioning," In *Proceedings of the Sixteenth International Conference on Architectural Support for Programming Languages and Operating Systems (ASPLOS XVI)*, pp. 213-224, ACM, New York, N.Y., 2011, the disclosure of which is incorporated by reference herein in its entirety). Non-critical data structures and fault-tolerance of representative applications may also be beneficial to some extent for power optimization. (See, e.g., Song Fu and Cheng-Zong Xu, "Exploring Event Correlation for Failure Prediction in Coalitions of Clusters," In *Proceedings of the 2007 ACM/IEEE Conference on Supercomputing*, pp. 41:1-41:12, New York, N.Y., 2007, the disclosure of which is incorporated by reference herein in its entirety). However, each of these mechanisms has limited effectiveness as used in existing solutions.

One or more embodiments of the invention provide a system, method and/or apparatus for anticipating the impacts of imminent memory failure when variable-strength ECC is used, and for performing memory management employing adjustable memory error protection based at least in part on selective reliability for energy efficiency improvement. Energy-efficiency improvement, according to one or more aspects of the invention, is a result of the decision to trade power savings for some potential corruption in selected data, where tolerable in a given application. This concept is referred to herein as "selective reliability." Note, that the use of stronger error correction in a memory generally results in the memory consuming more power. Thus, the invention, in one or more embodiments, facilitates energy-efficiency improvement by allowing the application to determine different levels of reliability depending on the data stored in different parts of the memory and controlling the strength of the ECC used accordingly. A method according to one or more embodiments is implemented as an operating system component, although aspects of the invention are not limited to such an implementation.

Aspects of the present disclosure are applicable to dynamic random access memory (DRAM), although embodiments are not limited to DRAM. For example, one or more embodiments of the invention are applicable to phase-change memory (PCM), resistor memory, and flash memory in solid-state drives (SSDs), among other memory types. The main difference in this case is in the implementation; in the case of flash in SSDs for instance, the implementation could be done at the flash controller level and be potentially transparent to the software. Dealing with data selectively in this case (e.g., indicating some files that can tolerate some corruption) would generally require support in the file system.

In particular, one or more embodiments provide for memory degradation notification at the operating system level of an HPC system for preventive notification of imminent or future memory failure. In this manner, memory management actions can be taken to avert a system failure or crash. One or more embodiments of the invention rely on a combination of health monitoring and corrected memory error monitoring (e.g., corrected errors with ECC, although essentially any variation in the rate of corrected error events produced by a correction mechanism can be used as a first sign of health degradation that triggers a health evaluation) to generate a notification indicating an imminent memory failure. As used herein, an imminent memory failure can be broadly defined as a future memory failure. The timeframe for a failure to occur may be, in one or more embodiments, intrinsically associated with a prescribed prediction accuracy and the particular mechanism using the notification; such timeframe may depend on the application.

In one or more embodiments, techniques of the invention rely, at least in part, on monitoring sensors in the main memory of the HPC system at runtime to dynamically predict the likelihood of a failure occurring in one or more memory blocks at per-die or finer granularity, and generating a notification (e.g., using a signal) indicating an imminent memory failure. One or more embodiments provide inexpensive access to real-time corrected memory error events and reconcile the events with health monitors accessible through monitoring interfaces. In this manner, embodiments of the invention define a correlation between a corrected memory error rate increase, as determined from monitoring of corrected error events, and the likelihood of a memory failure, as determined from health monitoring systems or alternative sensing means. An increase in corrected error rate is considered, in one or more embodiments, a first sign of a potential future memory failure. An increase in corrected error rate can be caused, in some instances, by a faulty memory portion being accessed multiple times or an evolving degradation processes. Other suitable causations for an increase in corrected error rate may apply.

Additionally, by including a hardware-specific correlation function in a hardware-independent failure model implementation, embodiments of the invention help ensure that health monitor readings, notification settings and event notifications are performed in a simplified and extensible way, applicable to a wide variety of scenarios. For example, hardware-independent failure models for a given memory technology can be used in distinct platforms, including distinct architecture and a memory controller. In accordance with one or more embodiments, notification preferences or settings enable controlling a tradeoff between the time (or time period) necessary for taking corrective actions before a failure occurs and the overhead of ensuring against a false positive. Embodiments of the invention provide for early signs of memory failure in proactive operating system mechanisms to be used to avoid system failure.

Figure 1:
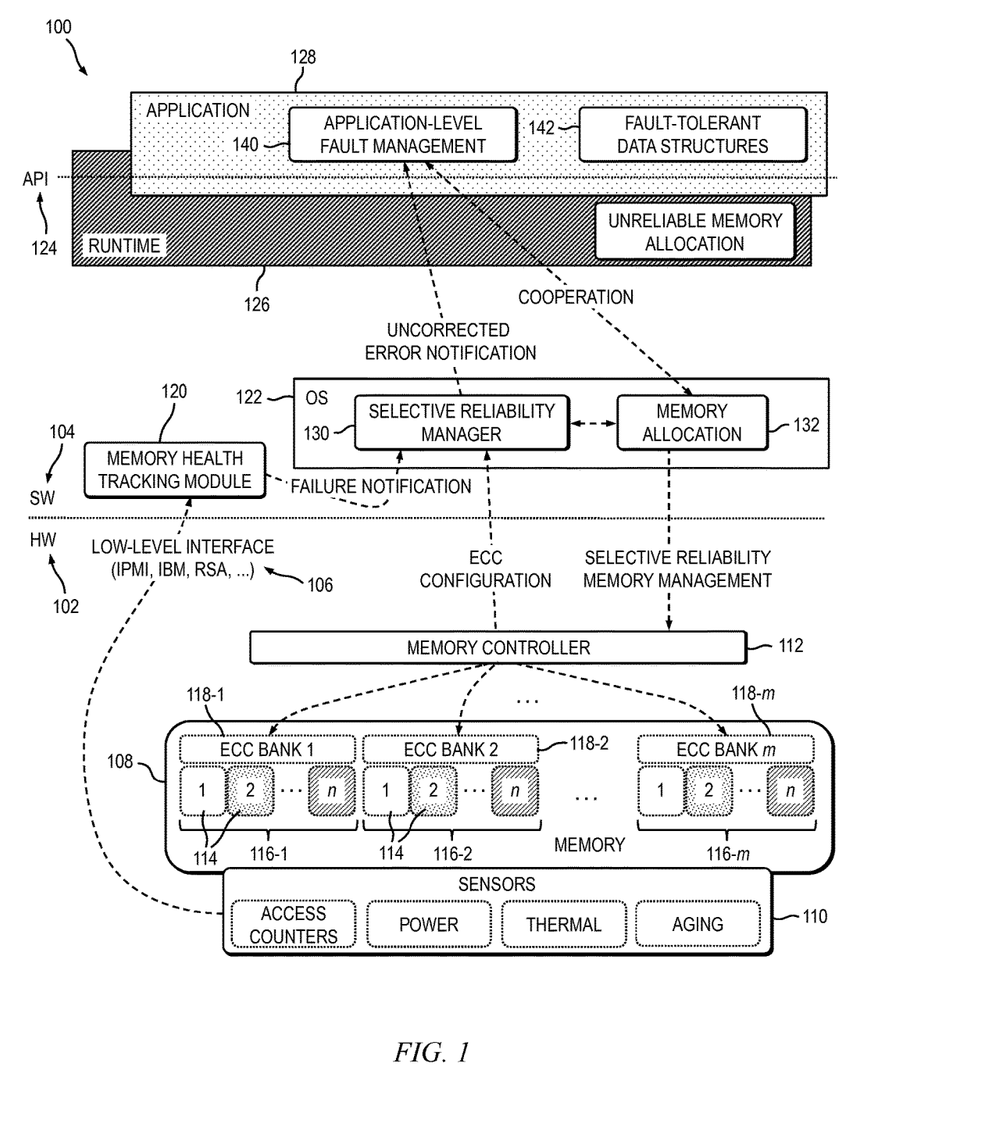
FIG. 1 is a block diagram depicting details of an exemplary system, according to an embodiment of the invention.
Figure 2:
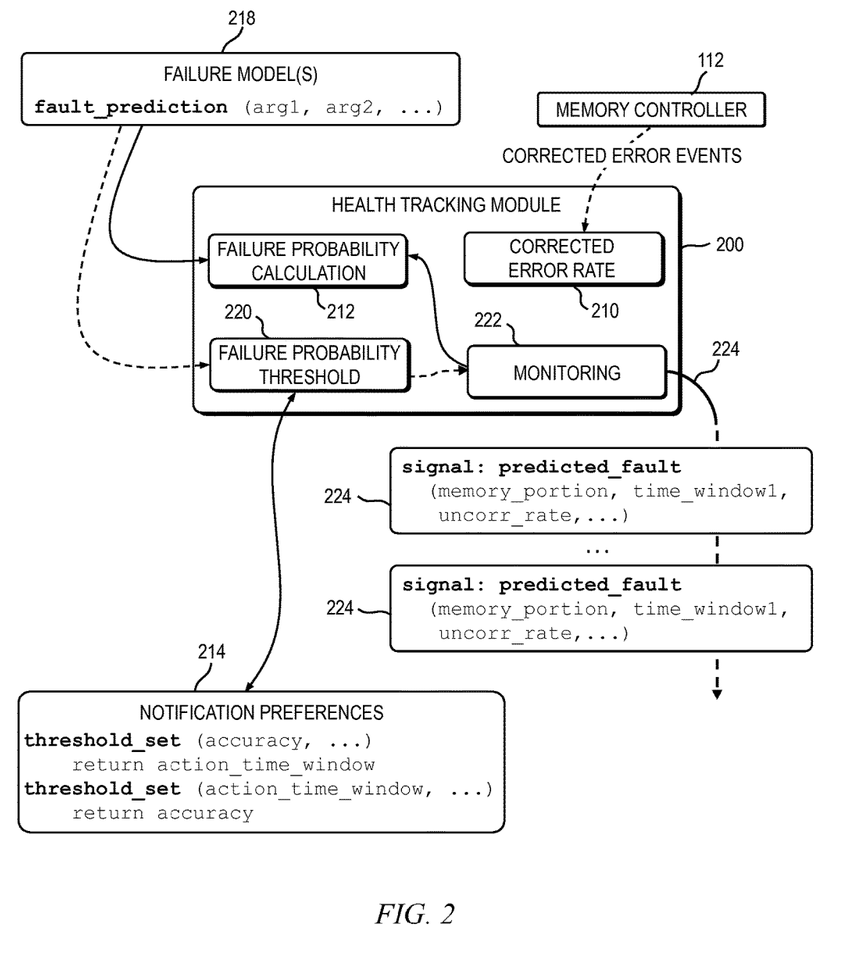
FIG. 2 is a block diagram depicting at least a portion of an exemplary memory health tracking module suitable for use in the exemplary system shown in FIG. 1, according to an embodiment of the invention.

In some embodiments, a health tracking module, details of which are described below in conjunction with FIGS. 1 and 2, provides a mechanism for notification of predictable failure in a memory or memory segment based on memory health deterioration. The module accesses hardware-specific health indicators (e.g., sensors) generating hardware-independent notification of memory health deterioration. Notifications of predictable memory failure, according to one or more embodiments, are based on the reading and interpretation of sensors providing indicators to detect degradation processes such as, for example, EM, NBTI, PBTI, TDDB and HCl, among other conditions, as previously stated.

An ECC strength applied to the specified portion or portions of memory in which a failure is predicted to occur is obtained, such as, for example, from memory controller settings, and used to determine whether the predicted failure can be corrected by the active ECC mechanism (i.e., the ECC mechanism currently being used) or whether an uncorrectable memory error will result. ECC strength, in one or more embodiments, can be measured as a function of one or more parameters of the active ECC mechanism, such as, but not limited to, correcting code length and/or correction capability. According to aspects of the invention, when it is determined (e.g., by the operating system or another system module) that the active ECC mechanism is insufficient to correct the predicted memory failures, the memory controller is operative to invoke a stronger ECC mechanism, if available, or to mitigate power overhead by tolerating data corruption through page reassignment and aggregation of non-critical data indicated by the application in the specified portion(s) of memory.

In order to further reduce power consumption in the system, the strength of the active ECC mechanism may be lowered (i.e., weakened) in portions of the memory in which an imminent failure is not predicted to occur and yet data stored in such portions of the memory are tolerable to potential corruption. As previously stated, power consumption in the memory directly correlates with the strength of the ECC mechanism used in the memory, and thus by lowering the strength of the active ECC mechanism in those portions of the memory which contain data tolerable to corruption, a reduction in power consumption can be achieved, in accordance with one or more embodiments of the invention.

With reference now to FIGS. 1 and 2, at least a portion of an exemplary HPC system 100 is depicted in FIG. 1, with an illustrative health tracking module implementation 200 depicted in FIG. 2, according to one or more embodiments of the invention. The exemplary system 100 includes both hardware components (HW) 102 and software components (SW) 104. In some embodiments, an interface 106 is used to facilitate the interaction between at least a portion of the hardware components 102 and the software components 104. The interface 106 may be a low-level interface, such as, for example, an intelligent platform management interface (IPMI) or an IBM remote supervisor adapter (RSA) interface; other suitable interfaces may also be used. The hardware components 102, in this embodiment, include a memory 108, a controller 112, and one or more sensors 110 configured to obtain information (i.e., detect) regarding conditions affecting the memory, or a segment thereof.

As described herein, the term "memory" may be used to indicate the memory as a whole or a particular segment thereof. Additionally, the memory 108 may comprise a standalone memory and/or an embedded memory. The memory 108 may comprise, for example, random access memory (RAM), such as, for instance, DRAM or static random access memory (SRAM). Other suitable memory types may also be used, including, but not limited to, content-addressable memory (CAM), phase change RAM (PCRAM), magnetic RAM (MRAM), etc.

The controller 112 included in the hardware components 102 is coupled with the memory 108 and is configured to control an operation of the memory 108. In one or more embodiments, the controller 112 is operative to vary a strength of the ECC mechanism used to protect data stored in the memory 108, as will be described further below. As shown in FIG. 1, the controller 112 resides externally to the memory 108, although at least a portion of the controller 112, or functionality thereof, may be integrated into the memory 108, according to one or more embodiments.

The memory 108 includes a plurality of memory cells (or blocks of memory cells) 114 divided into multiple memory banks, 116-1, 116-2 through 116-$m$, where m is an integer representing the number of banks of memory cells. In this embodiment, each of the memory banks 116-1 through 116-$m$ includes n memory cells (or blocks of memory cells), where n is an integer. In one or more other embodiments, the memory banks 116-1 through 116-$m$ may not all have the same number of memory cells; that is, the disclosure contemplates alternative ways in which to organize the memory cells. Each of the memory banks 116-1, 116-2 through 116-$m$ includes a corresponding ECC module, 118-1, 118-2 through 118-$m$, respectively. Each of the ECC modules 118-1 through 118-$m$ is configured to provide variable error correction functionality to its corresponding memory bank 114-1 through 114-$m$. The error correction functionality implemented by each of the ECC modules 118-1 through 118-$m$ is independently controlled, in this embodiment, by the memory controller 112. For example, in one or more embodiments, a strength of an ECC mechanism implemented in each of the ECC modules 118-1 through 118-$m$ is selectively controlled by the memory controller 112 as a function of one or more control signals received by the memory controller. A methodology for controlling the error correction functionality of the ECC modules 118-1 through 118-$m$ will be described in further detail herein below.

The sensors 110 preferably reside proximate to the memory 108; at least a portion of the sensors may be incorporated into the memory as shown in FIG. 1, although all or a portion of the sensors 110 may reside externally to the memory. The sensors 110 are operative to obtain information regarding one or more conditions affecting a performance of the memory 108 and/or overall system 100. For example, in one or more embodiments, conditions (or parameters) sensed or detected by the sensors 110 include power, temperature and aging variations; other conditions may be sensed or detected. In one or more embodiments, the sensors 110 comprise performance counters for tracking memory access patterns, (i.e., read/write operations). The sensors 110 may be configured to track other memory conditions as well.

In one or more embodiments, the software components 104 include a memory health tracking module 120, an operating system (OS) 122, and an application program interface (API) 124, which includes a runtime component 126 and an application component 128 associated therewith. The memory health tracking module 120, in this embodiment, is adapted to receive one or more signals generated by the sensors 110, either directly or through interface 106, and is operative to generate, as a function of the sensor signals, a failure notification output. The failure notification may be utilized by a component of the operating system (OS) 122, such as a selective reliability manager module 130, and/or by another software component in the system 100.

The selective reliability manager module 130, in one or more embodiments, is configured to communicate with a memory allocation module 132 included in the operating system 122 and an application-level fault management module 140 included in the application 128. The selective reliability manager module 130 also communicates with the memory controller 112. The selective reliability manager module 130, when used in conjunction with the memory controller 112, memory allocation module 132 and the application-level fault management module 140, provides a beneficial mechanism to control the active ECC configuration for effectively balancing memory error protection and power consumption objectives in the system 100. In one or more embodiments, the selective reliability manager module 130 is configured to read an ECC configuration from the memory controller 112, make decisions based on data classifications and/or other characteristics of the data, guide memory allocation based on these decisions, and define ECC configurations to be applied by the memory controller to the different memory banks 114-1 through 114-m, as will be described in further detail below.

FIG. 2 is a block diagram depicting at least a portion of an exemplary memory health tracking module 200, according to an embodiment of the invention. The memory health tracking module 200 represents an illustrative implementation of the memory health tracking module 120 shown in FIG. 1. In this embodiment, the memory health tracking module 200 includes a corrected error rate module 210, which is adapted to receive information from the memory controller 112 regarding corrected error events. The corrected error rate module 210, in some embodiments, is adapted to use this information to determine whether there is an increase in the corrected error rate. The memory health tracking module 200 also includes a failure probability calculation module 212, which is adapted to receive information from one or more hardware components 102, such as from the sensors 110, and/or from one or more software components 104 (FIG. 1), such as one or more failure models or tests 218, and is operative to calculate a failure probability as a function of the received information.

The memory health tracking module 200 further includes a failure probability threshold module 220 which is adapted to receive information from the one or more failure models 218 and notification preferences 214 and is configured to calculate a failure probability threshold as a function of the received information. The notification preferences 214 (e.g., as may be embodied in a notification settings module, for example) can, in one or more embodiments, be controlled by a user. The notification preferences 214 may be related to an action time window for when the imminent failure will occur or to a prediction accuracy of imminent failure.

As apparent from FIG. 2, the illustrative memory health tracking module 200 further includes a monitoring module 222 operative to monitor one or more aspects of the system 100 (FIG. 1), and when the threshold calculated by the threshold module 220 is exceeded (or otherwise crossed), the memory health tracking module, in some instances, generates one or more signals 224 indicative of an imminent memory failure for the memory 108 (FIG. 1) as a whole, or a particular segment thereof.

With continued reference to FIG. 1, the memory health tracking module 120 is depicted as residing externally to the operating system 122, although it is to be appreciated that at least a portion of the memory health tracking module may, in some embodiments, be incorporated into the operating system or another module. Additionally, although the memory health tracking module 120 is shown as being implemented entirely as a software component 104, at least a portion of the memory health tracking module may be implemented as a hardware component 102.

Figure 3:
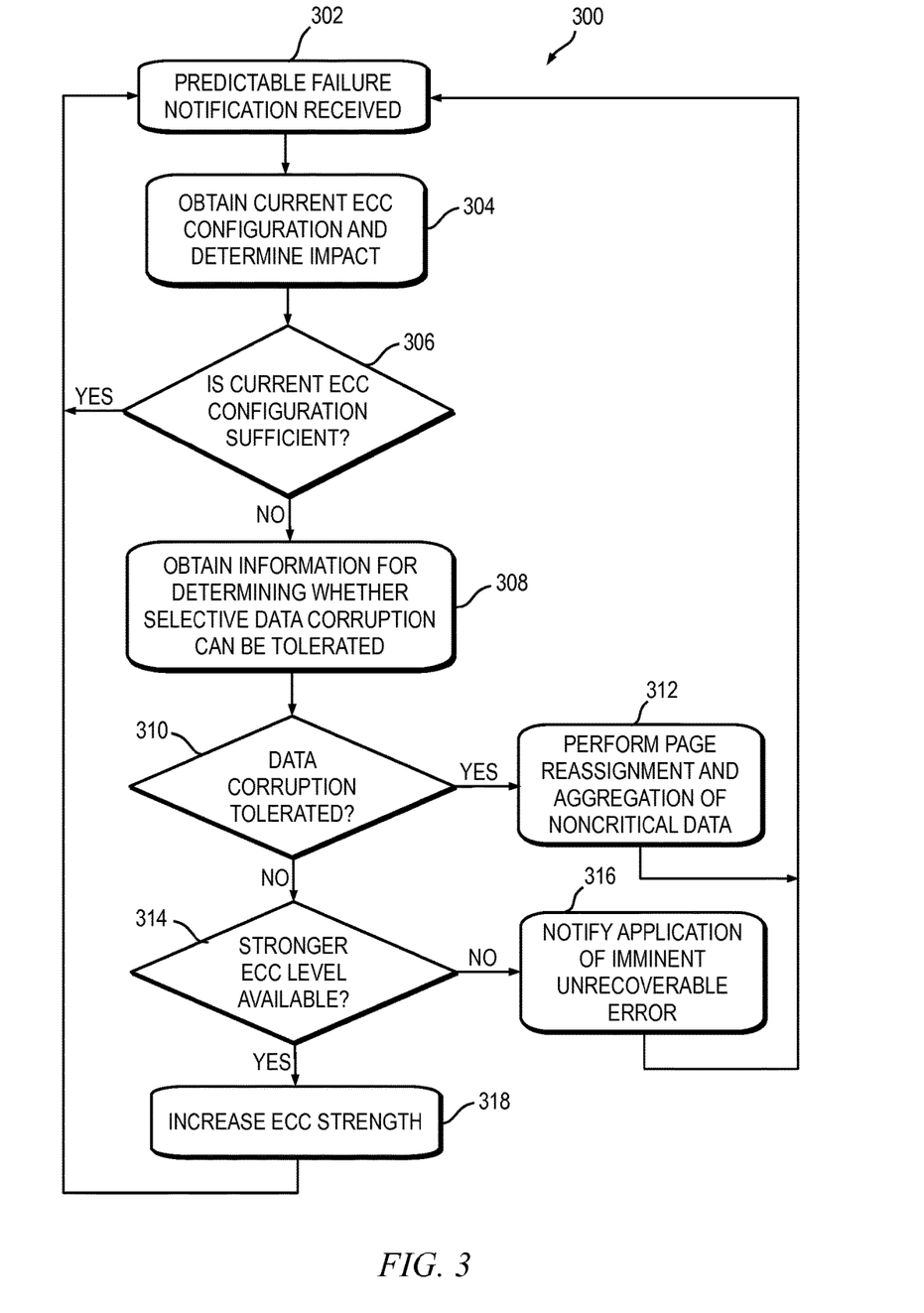
FIG. 3 is a flow diagram depicting at least a portion of an exemplary method for performing memory error protection and management, according to an embodiment of the invention.

In terms of operation, FIG. 3 is a flow diagram depicting at least a portion of an exemplary memory error protection and management methodology 300, according to an embodiment of the invention. With reference to FIGS. 1 and 3, the memory error protection and management methodology 300 begins in step 302 with the operating system 122 receiving a failure notification, such as from the memory health tracking module 120, regarding memory health degradation indicating a predicted imminent failure affecting a prescribed portion of the memory 108. In one or more embodiments, this failure notification is supplied to the selective reliability manager module 130 running on the operating system 122.

In step 304, the current ECC configuration used in the prescribed portion of memory affected by the predicted imminent failure is obtained. The current ECC configuration (e.g., ECC strength), which may be determined as a function of correcting code length and/or correction capability, among other parameters, is obtained from settings of the memory controller 112, in one or more embodiments, although other means for determining the current (i.e., active) ECC configuration are contemplated. Information regarding the current ECC configuration is used, in step 304, to determine whether the predicted failure(s) can be corrected by the active ECC mechanism, or whether an uncorrectable memory error will occur; that is, the current ECC configuration is used to evaluate the impact of the predicted imminent failure on the prescribed portion(s) of the memory 108 (e.g., whether or not the error can be corrected by the current ECC).

The operating system 122 (e.g., the selective reliability manager module 124) determines whether to request that the memory controller activate a stronger ECC level, if available, or to mitigate power overhead related to stronger ECC by tolerating data corruption, such as, for example, through page reassignment and aggregation of noncritical data indicated by the application in the prescribed memory area. Thus, in step 306, a determination is made as to whether the current ECC configuration is sufficient to correct one or more errors in the prescribed portion of memory impacted by the predicted imminent memory failure. If the current ECC configuration is determined to be sufficient to correct errors in the prescribed portion of memory impacted by the predicted imminent memory failure, no change in ECC strength is required and the method 300 continues to step 302 to wait for the next memory failure notification.

Alternatively, if the current ECC configuration is determined in step 306 to be insufficient to correct errors in the prescribed portion of memory impacted by the predicted imminent memory failure, step 308 obtains information, such as from the application 128 (e.g., from application-level fault-management module 140), which is used in determining whether selective data corruption can be tolerated for power optimization. Energy-efficiency improvement can be achieved with the decision by the application to trade energy savings for potential corruption of selected data. Energy savings are obtained by avoiding higher-level ECC, which correlates to higher power consumption in the system.

In step 310, a determination is made as to whether or not data corruption can be tolerated by the application 128. If data corruption can be tolerated (e.g., the application 128 includes fault-tolerant data structures 142), a request is supplied to the memory allocation module 132 running on the operating system 122 to perform page reassignment and aggregation of noncritical data in step 312 relating to at least the prescribed portion(s) of the memory 108 affected by the predictable imminent memory failure to thereby mitigate the effects of the memory failure. In one or more embodiments, memory mapping is used to identify memory pages and processes expected to be affected. The method 300 then continues at step 302 to wait for the next memory failure notification.

If it is determined in step 310 that data corruption cannot be tolerated, step 314 determines whether or not a stronger ECC level is available. If a stronger ECC level is not available, step 316 notifies the application of a likely imminent unrecoverable error in the prescribed portion of the memory 108. Otherwise, if a stronger ECC level is available, the ECC strength is increased in step 318 in at least the prescribed portion(s) of the memory 108 affected by the predicted imminent memory failure. The method 300 then returns to step 302 to wait for the next memory failure notification.

Aspects of the present invention monitor and adjust ECC schemes dynamically. By way of example only and without limitation or loss of generality, one or more embodiments rely on an interaction with the memory controller to access specific registers indicating the current ECC implementation enabled (i.e., active ECC scheme). An interface accessible by the operating system is used in one or more embodiments. Auto-adjusted ECC by hardware mechanisms, while implementing specific and software-transparent methods to determine the ECC level needed for a given scenario, are expected to update read-only status registers indicating the error protection strength enabled. Software-adjusted variable ECC provides an interface for the operating system to set memory controller registers for prescribed error protection levels. The ECC level corresponding to each bank of memory (e.g., 118-1 through 118-m in FIG. 1) may be independently set and may be different relative to one or more other banks of memory, in accordance with one or more embodiments.

Combining the notification of imminent memory failure and ECC settings, aspects of the present disclosure determine whether an uncorrectable memory error is predictable and determine the physical address or addresses likely to be affected by the predicted memory failure. Memory mapping is used to identify memory pages and processes expected to be affected. In embodiments wherein the ECC level is auto-adjusted, the operating system 122 can only notify the affected processes about a predicted uncorrectable memory error. Relying on an API 124, the operating system 122 notifies applications 128 about an imminent system crash in case the error is expected to corrupt the operating system, or indicates memory pages that will be corrupted for application-level fault handling.

In embodiments wherein the memory controller allows the ECC level to be dynamically defined by the operating system, aspects of the present disclosure can be used to selectively manage memory reliability. This approach enables power reduction by using weaker ECC levels for non-critical data that can be at least partially corrupted. Embodiments of the invention apply the concept of data classes and cooperate with the application through the API to indicate non-critical data. Stronger and more costly ECC (in terms of system overhead and/or complexity, for example), in one or more embodiments, is proactively applied to prescribed memory areas holding critical data when an uncorrectable error is predicted to affect these prescribed memory areas; for example, memory areas used by critical operating system data structures and other critical data indicated by the application.

When no stronger ECC is available, a notification is generated (e.g., by the operating system) indicating the expected corruption of critical data due to an uncorrectable memory error. When the uncorrectable error is predicted to impact memory areas holding non-critical data, memory error protection is relaxed, in one or more embodiments, based on a tolerance threshold. With virtual memory support, memory pages including critical application data is reassigned and aggregated for proactive strengthening of memory error protection, according to one or more embodiments of the invention.

Given the discussion thus far, it will be appreciated that, in general terms, an exemplary method for providing selective memory error protection responsive to a predictable failure notification associated with at least one portion of a memory in a computing system, according to an aspect of the invention, includes the steps of: obtaining an active ECC configuration corresponding to the at least one portion of the memory; determining whether the active ECC configuration is sufficient to correct at least one error in the portion of the memory affected by the predictable failure notification; when the active ECC configuration is insufficient to correct the at least one error, determining whether data corruption can be tolerated by an application running on the computing system; when data corruption cannot be tolerated by the application, determining whether a stronger ECC level is available and, if a stronger ECC level is available, increasing a strength of the active ECC configuration; and when data corruption can be tolerated, performing page reassignment and aggregation of non-critical data. The present invention further provides, in some embodiments, notifying the application of an imminent unrecoverable error when data corruption cannot be tolerated by the application and a stronger ECC level is not available.

The present invention provides, in one or more embodiments, using memory mapping to identify memory pages and/or processes expected to be affected by a predictable failure notification.

In one or more embodiments, the present invention provides an apparatus for performing selective memory error protection in a high-performance computing system. The apparatus includes a memory and at least one processor coupled with the memory. The processor, responsive to a predictable failure notification associated with at least one portion of the memory, is configured: to obtain an active ECC configuration corresponding to the at least one portion of the memory; to determine whether the active ECC configuration is sufficient to correct at least one error in the at least one portion of the memory affected by the predictable failure notification; to determine, when the active ECC configuration is insufficient to correct the at least one error, whether data corruption can be tolerated by an application running on the computing system; to determine, when data corruption cannot be tolerated by the application, whether a stronger ECC level is available and if, a stronger ECC level is available, to increase a strength of the active ECC configuration; and, when data corruption can be tolerated, to perform page reassignment and aggregation of non-critical data in the memory.

Exemplary System and Article of Manufacture Details

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

One or more embodiments of the invention, or elements thereof, can be implemented in the form of an apparatus including a memory and at least one processor that is coupled to the memory and operative to perform exemplary method steps.

Figure 4:
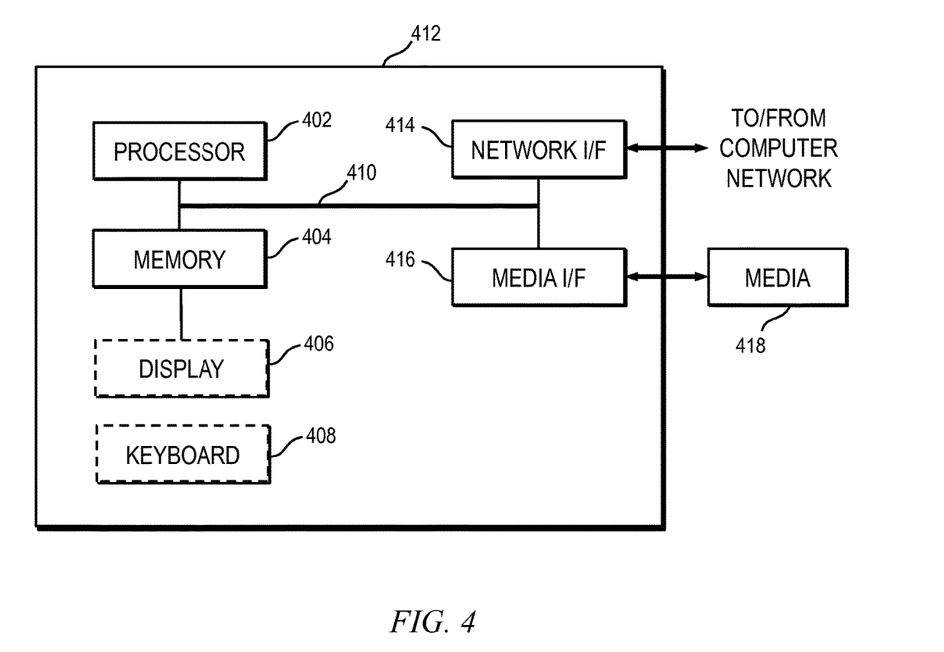
FIG. 4 depicts a computer system that may be useful in implementing one or more aspects and/or elements of the invention.

One or more embodiments can make use of software running on a general purpose computer or workstation which, when configured according to one or more embodiments of the invention, becomes a special-purpose apparatus. With reference to FIG. 4, such an implementation might employ, for example, a processor 402, a memory 404, and an input/output interface formed, for example, by a display 406 and a keyboard 408. The term "processor" as used herein is intended to include any processing device, such as, for example, one that includes a CPU (central processing unit) and/or other forms of processing circuitry. Further, the term "processor" may refer to more than one individual processor. The term "memory" is intended to include memory associated with a processor or CPU, such as, for example, RAM (random access memory), ROM (read only memory), a fixed memory device (for example, hard drive), a removable memory device (for example, diskette), a flash memory and the like. In addition, the phrase "input/output interface" as used herein, is intended to include, for example, one or more mechanisms for inputting data to the processing unit (for example, mouse), and one or more mechanisms for providing results associated with the processing unit (for example, printer). The processor 402, memory 404, and input/output interface such as display 406 and keyboard 408 can be interconnected, for example, via bus 410 as part of a data processing unit 412. Suitable interconnections, for example via bus 410, can also be provided to a network interface 414, such as a network card, which can be provided to interface with a computer network, and to a media interface 416, such as a diskette or CD-ROM drive, which can be provided to interface with media 418.

Accordingly, computer software including instructions or code for performing the methodologies of the invention, as described herein, may be stored in one or more of the associated memory devices (for example, ROM, fixed or removable memory) and, when ready to be utilized, loaded in part or in whole (for example, into RAM) and implemented by a CPU. Such software could include, but is not limited to, firmware, resident software, microcode, and the like.

A data processing system suitable for storing and/or executing program code will include at least one processor 402 coupled directly or indirectly to memory elements 404 through a system bus 410. The memory elements can include local memory employed during actual implementation of the program code, bulk storage, and cache memories which provide temporary storage of at least some program code in order to reduce the number of times code must be retrieved from bulk storage during implementation.

Input/output or I/O devices (including but not limited to keyboards 408, displays 406, pointing devices, and the like) can be coupled to the system either directly (such as via bus 410) or through intervening I/O controllers (omitted for clarity).

Network adapters such as network interface 414 may also be coupled to the system to enable the data processing system to become coupled to other data processing systems or remote printers or storage devices through intervening private or public networks. Modems, cable modem and Ethernet cards are just a few of the currently available types of network adapters.

As used herein, including the claims, a "server" includes a physical data processing system (for example, system 412 as shown in FIG. 4) running a server program. It will be understood that such a physical server may or may not include a display and keyboard.

As noted, aspects of the present invention may take the form of a computer program product embodied in one or more computer readable medium(s) having computer readable program code embodied thereon. Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. Media block 418 is a non-limiting example. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or flash memory), an optical fiber, a portable compact disc read-only memory (CD-ROM), an optical storage device, a magnetic storage device, or any suitable combination of the foregoing. In the context of this document, a computer readable storage medium may be any non-transitory medium that can contain, or store a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described herein with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

It should be noted that any of the methods described herein can include an additional step of providing a system comprising distinct software modules embodied on a non-transitory computer readable storage medium; the modules can include, for example, any or all of the elements depicted in the block diagrams and/or described herein; by way of example and not limitation, a memory health tracking module and a selective reliability manager module. The method steps can then be carried out using the distinct software modules and/or sub-modules of the system, as described above, executing on one or more hardware processors 402. Further, a computer program product can include a non-transitory computer-readable storage medium with code adapted to be implemented to carry out one or more method steps described herein, including the provision of the system with the distinct software modules.

In any case, it should be understood that the components illustrated herein may be implemented in various forms of hardware, software, or combinations thereof; for example, application specific integrated circuits (ASICs), functional circuitry, one or more appropriately programmed general purpose digital computers with associated memory, and the like. Given the teachings of the invention provided herein, one of ordinary skill in the related art will be able to contemplate other implementations of the components of the invention.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method for providing selective error protection for a memory in a computing system, the method comprising:
   predicting a number of future errors likely to occur in at least one portion of the memory;
   obtaining an active error correcting code (ECC) configuration for the at least one portion of the memory;
   determining whether the active ECC configuration is sufficient to correct the number of predicted future errors in the at least one portion of the memory;
   at least when the active ECC configuration is insufficient, determining whether data in the at least one portion of the memory is critical to an application running on the computing system;
   when the data is not critical, tolerating corruption of the data; and
   when the data is critical, determining whether a stronger ECC level is available and, when the stronger ECC level is available, increasing a strength of the active ECC configuration for the at least one portion of the memory.

2. The method of claim 1, further comprising notifying the application that one or more predicted future errors cannot be corrected when the stronger ECC level is not available.

3. The method of claim 2, further comprising notifying the application that one or more predicted future errors cannot be corrected only when the data is critical.

4. The method of claim 1, wherein tolerating corruption of the data comprises performing page reassignment and aggregation of the data within the at least one portion of the memory.

5. The method of claim 1, wherein tolerating corruption of the data comprises, when the active ECC configuration is sufficient, reducing power consumption by the at least one portion of the memory.

6. The method of claim 5, wherein reducing power consumption by the at least one portion of the memory comprises, when the active ECC configuration is sufficient, decreasing the strength of the active ECC configuration.

7. The method of claim 1, wherein predicting the number of future errors comprises monitoring a variation in a rate of corrected error events produced by an ECC mechanism currently being used for the at least one portion of the memory.

8. The method of claim 1, wherein predicting the number of future errors comprises detecting whether the at least one portion of the memory is degraded by a non-uniform aging process.

9. The method of claim 1, wherein increasing the strength of the active ECC configuration comprises increasing at least one of a correcting code length and a correction capability corresponding to an ECC mechanism currently being used.

10. The method of claim 1, wherein determining whether the data is critical comprises performing memory mapping to identify memory pages and processes expected to be affected by the errors.

11. The method of claim 1, wherein determining whether the data is critical comprises classifying the data based on whether the application can tolerate corruption of the data.

12. The method of claim 1, wherein a resolution of the selective error protection is controlled as a function of a classification of the data.

13. The method of claim 11, wherein determining whether the data is critical comprises an application program interface (API) of the application indicating whether the application can tolerate corruption of the data.

14. The method of claim 11, wherein determining whether the data is critical comprises:
classifying the data as critical when the at least one portion of the memory comprises one or more operating system data structures; and
classifying the data as non-critical when the at least one portion of the memory comprises one or more fault-tolerant data structures.

15. An apparatus for performing selective memory error protection in a computing system, the apparatus comprising:
a memory; and
at least one processor coupled to the memory, the processor being configured:
to predict a number of future errors likely to occur in at least one portion of the memory;
to obtain an active error correcting code (ECC) configuration corresponding to the at least one portion of the memory;
to determine whether the active ECC configuration is sufficient to correct the number of predicted future errors in the at least one portion of the memory;
at least when the active ECC configuration is insufficient, to determine whether data in the at least one portion of the memory is critical to an application running on the computing system;
when the data is not critical, to tolerate corruption of the data; and
when the data is critical, to determine whether a stronger ECC level is available and, when the stronger ECC level is available, to increase a strength of the active ECC configuration.

16. The apparatus of claim 15, wherein the memory comprises a plurality of memory banks and a plurality of ECC modules, each of the ECC modules being operatively coupled with a corresponding one of the memory banks, the processor being configured to classify data used by the application based on a tolerance of the data to corruption and to allocate the data to the memory banks as a function of a classification of the data.

17. The apparatus of claim 16, further comprising:
a memory controller operatively coupled to the memory and configured to independently vary respective strengths of individual ones of the plurality of ECC modules; and
a memory health tracking module configured:
to receive from the memory controller at least a first signal indicating a number of corrected error events produced by at least one of the plurality of ECC modules; and
to generate at least one output wherein at least a portion of the at least one output indicates a variation in a rate of the corrected error events produced by at least one of the plurality of ECC modules;
wherein the number of future errors is predicted based at least in part on the at least one output generated by the memory health tracking module; and
wherein the at least one output is generated by the memory health tracking module based at least in part on the at least first signal;
such that the number of future errors is predicted based at least in part on the at least first signal.

18. The apparatus of claim 17, further comprising at least one sensor hardware component configured to monitor a health status of the at least one portion of the memory;
wherein the memory health tracking module is further configured to receive from at least one sensor at least a second signal indicating a health status of the at least one portion of the memory; and
wherein the at least one output is generated by the memory health tracking module based at least in part on the at least first signal and the at least second signal;
such that the number of future errors is predicted based at least in part on the at least first signal and the at least second signal.

19. The apparatus of claim 18, wherein at least a portion of the at least second signal indicates whether the at least one portion of the memory is degraded by a non-uniform aging process.

20. The apparatus of claim 18, further comprising at least one hardware-independent failure model;
wherein the at least one output is generated by the memory health tracking module based at least in part on the at least first signal, the at least second signal, and the at least one failure model;
such that the number of future errors is predicted based at least in part on the at least first signal, the at least second signal, and the at least one failure model.

* * * * *